United States Patent
Nanao et al.

(10) Patent No.: US 11,804,360 B2
(45) Date of Patent: Oct. 31, 2023

(54) MULTI CHARGED PARTICLE BEAM ADJUSTMENT METHOD, MULTI CHARGED PARTICLE BEAM IRRADIATION METHOD, AND MULTI CHARGED PARTICLE BEAM IRRADIATION APPARATUS

(71) Applicant: NuFlare Technology, Inc., Yokohama (JP)

(72) Inventors: Tsubasa Nanao, Yokohama (JP); Hirofumi Morita, Yokohama (JP); Takanao Touya, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/778,758

(22) PCT Filed: Nov. 4, 2020

(86) PCT No.: PCT/JP2020/041173
§ 371 (c)(1),
(2) Date: May 20, 2022

(87) PCT Pub. No.: WO2021/100463
PCT Pub. Date: May 27, 2021

(65) Prior Publication Data
US 2023/0005711 A1    Jan. 5, 2023

(30) Foreign Application Priority Data
Nov. 21, 2019    (JP) .................................. 2019-210594

(51) Int. Cl.
*H01J 37/304*    (2006.01)
*H01J 37/12*    (2006.01)
(Continued)

(52) U.S. Cl.
CPC .......... *H01J 37/304* (2013.01); *G03F 7/7005* (2013.01); *G03F 7/7055* (2013.01);
(Continued)

(58) Field of Classification Search
CPC .......... H01J 37/304; H01J 37/12; H01J 37/14; H01J 37/3177; H01J 37/045; H01J 37/09; H01J 2237/0435
See application file for complete search history.

(56) References Cited

U.S. PATENT DOCUMENTS

| 6,667,486 | B2 | 12/2003 | Ohta et al. |
| 6,784,442 | B2 | 8/2004 | Muraki et al. |

(Continued)

FOREIGN PATENT DOCUMENTS

| JP | 2000-058445 A | 2/2000 |
| JP | 2003-203836 A | 7/2003 |

(Continued)

OTHER PUBLICATIONS

International Search Report dated Jan. 19, 2021 in PCT/JP2020/041173 filed on Nov. 4, 2020, 2 pages.
(Continued)

*Primary Examiner* — Sean M Luck
(74) *Attorney, Agent, or Firm* — Oblon, McClelland, Maier & Neustadt, L.L.P.

(57) ABSTRACT

The present invention quickly calculates values of optimal excitation parameters which are set in lenses in multiple stages. A multi charged particle beam adjustment method includes forming a multi charged particle beam, calculating, for each of lenses in two or more stages disposed corresponding to object lenses in two or more stages, a first rate of change and a second rate of change in response to change in at least an excitation parameter, the first rate of change being a rate of change in a demagnification level of a beam
(Continued)

image of the multi charged particle beam, the second rate of change being a rate of change in a rotation level of the beam image, and calculating a first amount of correction to the excitation parameter of each of the lenses based on an amount of correction to the demagnification level and the rotation level of the beam image, the first rate of change, and the second rate of change.

9 Claims, 4 Drawing Sheets

(51) Int. Cl.
  *H01J 37/14* (2006.01)
  *H01J 37/317* (2006.01)
  *H01J 37/04* (2006.01)
  *G03F 7/00* (2006.01)
  *H01J 37/09* (2006.01)
(52) U.S. Cl.
  CPC .......... *G03F 7/70383* (2013.01); *H01J 37/12* (2013.01); *H01J 37/14* (2013.01); *H01J 37/3177* (2013.01); *H01J 37/045* (2013.01); *H01J 37/09* (2013.01); *H01J 2237/0435* (2013.01)

(56) References Cited

U.S. PATENT DOCUMENTS

| | | |
|---|---|---|
| 8,884,254 B2 | 11/2014 | Touya et al. |
| 8,927,941 B2 | 1/2015 | Touya et al. |
| 10,504,686 B2 | 12/2019 | Ogasawara et al. |
| 2013/0240720 A1* | 9/2013 | Sugiyama ............ H01J 37/304 250/252.1 |
| 2014/0175303 A1 | 6/2014 | Touya et al. |
| 2016/0056011 A1* | 2/2016 | Khursheed ............ H01J 37/153 250/396 ML |

FOREIGN PATENT DOCUMENTS

| | | |
|---|---|---|
| JP | 2003-297732 A | 10/2003 |
| JP | 2003-332206 A | 11/2003 |
| JP | 2004-241611 A | 8/2004 |
| JP | 2007-208038 A | 8/2007 |
| JP | 2012-212774 A | 11/2012 |
| JP | 2013-197289 A | 9/2013 |
| JP | 2014-127568 A | 7/2014 |
| JP | 2018-198235 A | 12/2018 |

OTHER PUBLICATIONS

Taiwanese Office Action dated Jan. 6, 2022 in Taiwanese Application No. 109140042, 9 pages (with unedited computer-generated English Translation).

* cited by examiner

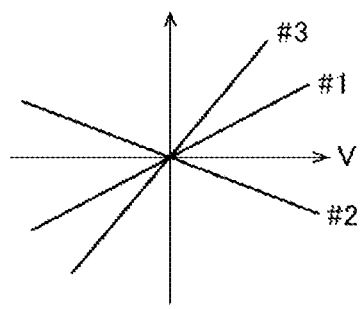
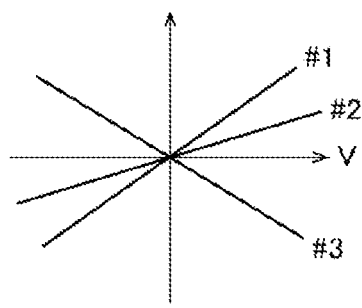
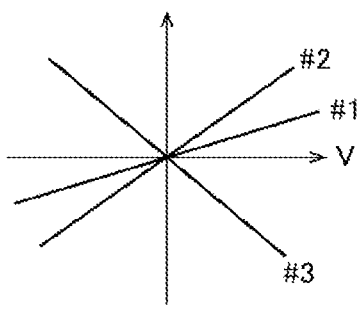
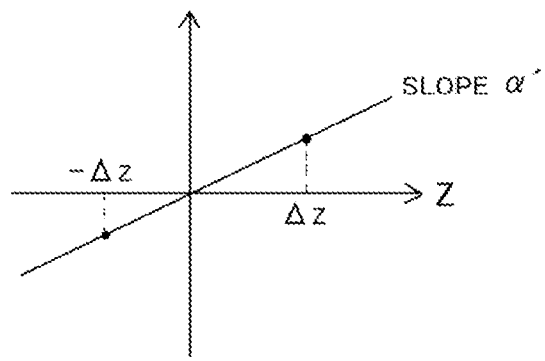
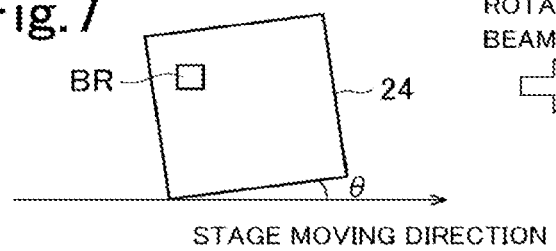
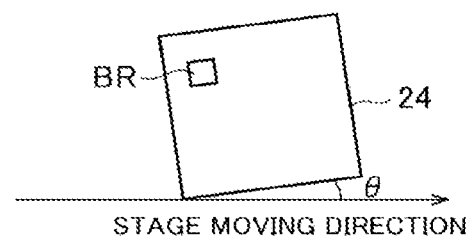

MULTI CHARGED PARTICLE BEAM ADJUSTMENT METHOD, MULTI CHARGED PARTICLE BEAM IRRADIATION METHOD, AND MULTI CHARGED PARTICLE BEAM IRRADIATION APPARATUS

TECHNICAL FIELD

The present invention relates to a multi charged particle beam adjustment method, a multi charged particle beam irradiation method, and a multi charged particle beam irradiation apparatus.

BACKGROUND

As LSI circuits are increasing in density, the line width of circuits of semiconductor devices is becoming finer. To form a desired circuit pattern onto a semiconductor device, a method of demagnifying and transferring, by using a demagnification-projection exposure apparatus, onto a wafer a highly precise original image pattern formed on a quartz is employed. The highly precise original image pattern is written by using an electron beam writing apparatus, in which a technology commonly known as electron beam lithography is used.

A writing apparatus using a multi-beam is being developed as an electron beam writing apparatus to replace an existing single beam writing apparatus which deflects a single beam, and irradiates a desired portion on a substrate with the beam. Many beams can be radiated using a multi-beam, as compared with when writing is performed with a single electron beam, thus the throughput can be significantly improved. In a multi beam writing apparatus, for example, an electron beam discharged from an electron gun passes through an aperture member having multiple openings to form a multi-beam, and blanking control is performed on each of the multi-beam by a blanking plate. The beam not blocked is demagnified by an optical system, and radiated to a substrate placed on a movable stage.

In an electron beam writing apparatus, the beam of each shot is focused on a substrate by object lenses, and focus correction (dynamic focusing) is dynamically performed using, for example, electrostatic lenses to cope with the unevenness on the substrate surface during writing. However, when dynamic focusing is performed, rotation and magnification change of a beam image occur on the substrate, thus the writing positional accuracy is degraded. Thus, it is required that the rotation and magnification change of a beam image due to the dynamic focusing be reduced as much as possible.

In order to reduce the rotation and magnification change of a beam image due to dynamic focusing, it has been proposed that electrostatic lenses in multiple stages be provided, and a voltage to be applied to each electrostatic lens be determined by a simulation or an experiment (see, for example, PTL 6). However, a tolerance and an analysis error occur between a simulation and an actual machine. In addition, a specific technique to determine the voltage to be applied to the electrostatic lens by an experiment has not been disclosed.

CITATION LIST

Patent Literature

PTL 1: Japanese Unexamined Patent Application Publication No. 2003-332206

PTL 2: Japanese Unexamined Patent Application Publication No. 2003-297732

PTL 3: Japanese Unexamined Patent Application Publication No. 2003-203836

PTL 4: Japanese Unexamined Patent Application Publication No. 2014-127568

PTL 5: Japanese Unexamined Patent Application Publication No. 2018-198235

PTL 6: Japanese Unexamined Patent Application Publication No. 2013-197289

SUMMARY OF INVENTION

It is an object of the present invention to provide a multi charged particle beam adjustment method, a multi charged particle beam irradiation method, and a multi charged particle beam irradiation apparatus which are capable of quickly calculating the values of optimal excitation parameters which are set in lenses in multiple stages to reduce the rotation and magnification change of a beam image due to dynamic focusing.

According to one aspect of the present invention, a multi charged particle beam adjustment method includes forming a multi charged particle beam, calculating, for each of lenses in two or more stages disposed corresponding to object lenses in two or more stages, a first rate of change and a second rate of change in response to change in at least an excitation parameter, the first rate of change being a rate of change in a demagnification level of a beam image of the multi charged particle beam, the second rate of change being a rate of change in a rotation level of the beam image, and calculating a first amount of correction to the excitation parameter of each of the lenses based on an amount of correction to the demagnification level and the rotation level of the beam image, the first rate of change, and the second rate of change.

According to one aspect of the present invention, a multi charged particle beam irradiation method includes forming a multi charged particle beam, calculating, for each of lenses in two or more stages disposed corresponding to object lenses in two or more stages, a first rate of change and a second rate of change in response to change in at least an excitation parameter, the first rate of change being a rate of change in a demagnification level of a beam image of the multi charged particle beam, the second rate of change being a rate of change in a rotation level of the beam image, calculating a first amount of correction to the excitation parameter of each of the lenses based on an amount of correction to the demagnification level and the rotation level of the beam image, the first rate of change, and the second rate of change, and setting the excitation parameter with the first amount of correction added to the lenses, and irradiating a substrate with the multi charged particle beam.

According to one aspect of the present invention, a multi charged particle beam irradiation apparatus includes a plurality of blankers performing blanking deflection on respective parts of a multi charged particle beam, a limiting aperture member blocking beams which are deflected by the plurality of blankers to assume a beam off state, object lenses in two or more stages, that focus the multi charged particle beam which has passed the limiting aperture member to a substrate, lenses in two or more stages disposed corresponding to the object lenses, and a controller calculating a first amount of correction to an excitation parameter of each of the lenses based on a first rate of change, a second rate of change, and an amount of correction in response to change in the excitation parameter for each of the lenses, and setting the excitation parameter with the first amount of correction added to the lenses, the first rate of change being a rate of change in a demagnification level of a beam image of the multi charged particle beam, the second rate of change being a rate of change in a rotation level of the beam image, the amount of correction being made to the demagnification level and the rotation level of the beam image.

Advantageous Effects of Invention

According to the present invention, it is possible to quickly calculate the values of optimal excitation parameters which are set in lenses in multiple stages to reduce the rotation and magnification change of a beam image due to dynamic focusing.

BRIEF DESCRIPTION OF DRAWINGS

FIG. 5a is a graph showing a change in demagnification term of a beam image with respect to voltage, FIG. 5b is a graph showing a change in rotational term of a beam image with respect to voltage, and FIG. 5c is a graph showing a change in focus position with respect to voltage.

FIG. 6 is a graph showing a change in a demagnification term of a beam image with respect to Z height.

FIG. 7 is a view showing rotation of a substrate with respect to a stage movement direction.

DESCRIPTION OF EMBODIMENTS

Hereinafter, an embodiment of the present invention will be described with reference to the drawings.

Figure 1:
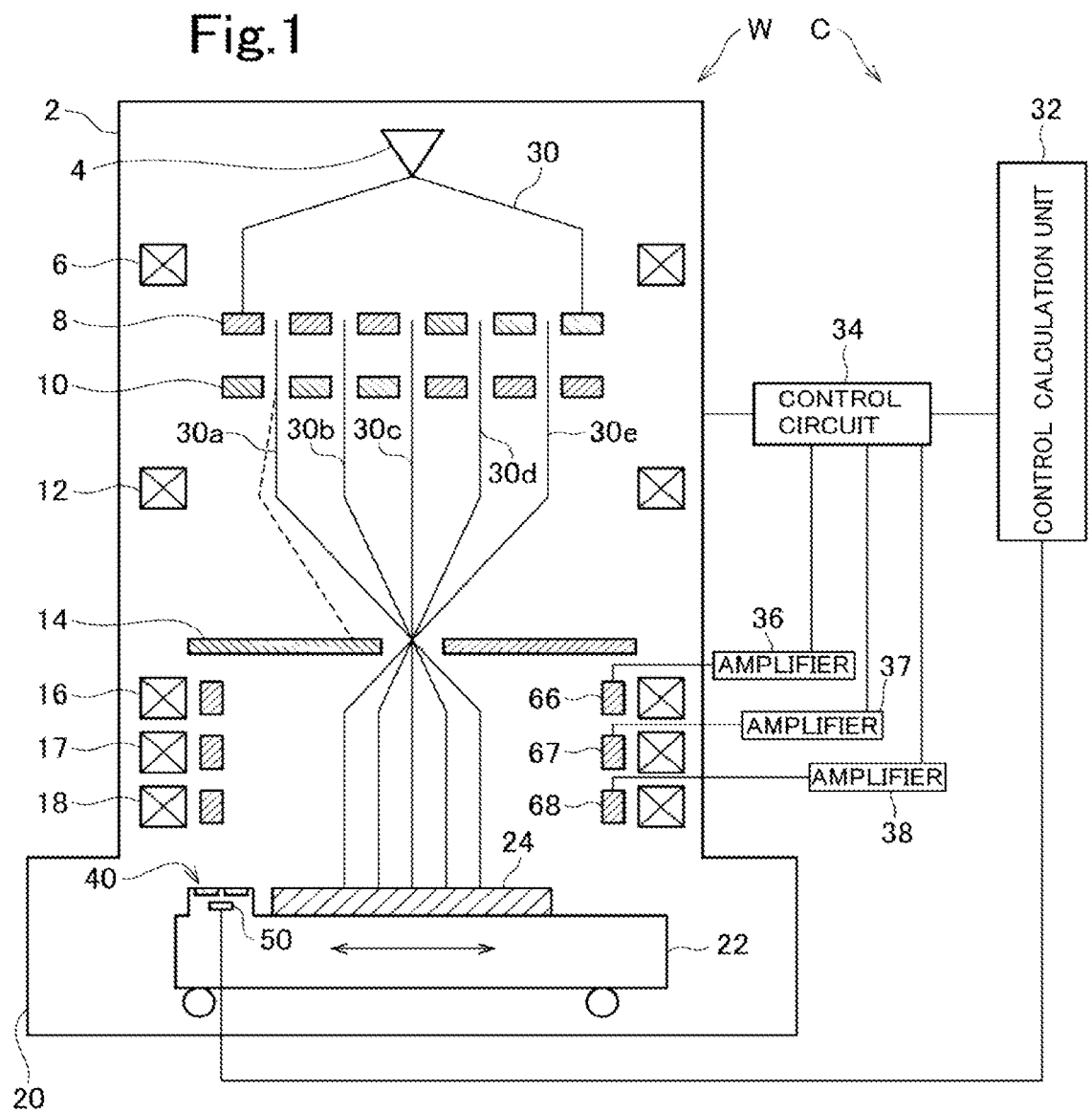
FIG. 1 is a schematic diagram of a multi charged particle beam writing apparatus according to an embodiment of the present invention.

FIG. 1 is a schematic diagram of a multi charged particle beam writing apparatus according to an embodiment of the present invention. In the present embodiment, as an example of a charged particle beam, a configuration using an electron beam will be described. However, the charged particle beam is not limited to an electron beam, and another charged particle beam, such as an ion beam may be used.

The writing apparatus includes: a writer W that writes a desired pattern by irradiating a substrate 24 as a writing target with an electron beam; and a controller C that controls the operation of the writer W.

The writer W has an electron beam column 2 and a writing chamber 20. In the electron beam column 2, an electron gun 4, an illuminating lens 6, an aperture member 8, a blanking plate 10, a demagnifying lens 12, a limiting aperture member 14, objective lenses in three stages 16, 17, 18, and electrostatic lenses in three stages 66, 67, 68 are disposed. The electrostatic lens 66 is disposed in the magnetic field of the object lens 16 comprised of an electromagnetic lens. The electrostatic lens 67 is disposed in the magnetic field of the object lens 17 comprised of an electromagnetic lens. The electrostatic lens 68 is disposed in the magnetic field of the object lens 18 comprised of an electromagnetic lens.

An XY stage 22 is disposed in the writing chamber 20. The substrate 24 as a writing target is placed on the XY stage 22. The substrate 24 as a writing target is, for example, a mask blank or a semiconductor substrate (silicon wafer).

In addition, an inspection aperture 40 and a current detector 50 are disposed on the XY stage 22 at a position different from the position where the substrate 24 is placed. The inspection aperture 40 is preferably installed at the position with the same height as the substrate 24.

In the inspection aperture 40, an opening is formed which allows only one electron beam among a multi-beam to pass through. The electron beam, which has passed through the opening of the inspection aperture 40, enters the current detector 50, and a beam current is detected. For example, an SSD (semiconductor detector (solid-state detector)) may be used as the current detector 50. Results of the detection by the current detector 50 are notified to a control calculation unit 32.

Figure 2:
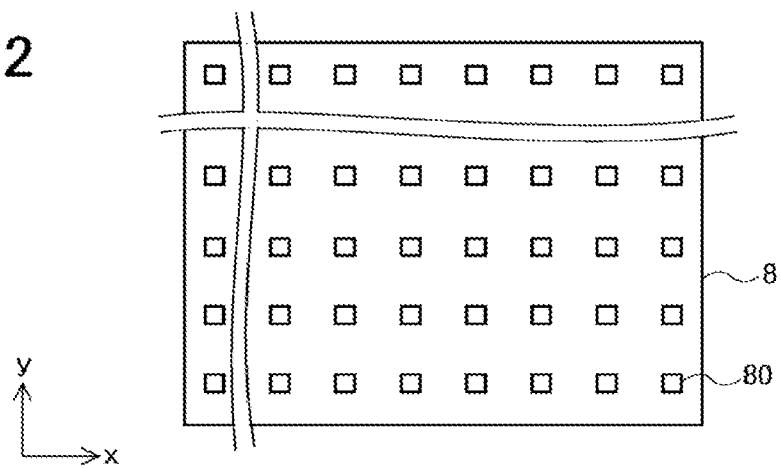
FIG. 2 is a schematic view of an aperture member.

An electron beam 30 discharged from the electron gun 4 (discharge unit) illuminates the entire aperture member 8 substantially perpendicularly by the illuminating lens 6. FIG. 2 is a conceptual diagram showing the configuration of the aperture member 8. In the aperture member 8, openings 80 with m vertical (y direction) rows×n horizontal (x direction) rows (m, n≥2) are formed in a matrix shape with a predetermined arrangement pitch. For example, the openings 80 with 512 rows×512 rows are formed. The openings 80 are formed of rectangles in the same dimensional shape. The openings 80 may be circles with the same diameter.

The electron beam 30 illuminates a region including all the openings 80 of the aperture member 8. Respective portions of the electron beam 30 pass through these multiple openings 80, thereby forming multi-beam 30a to 30e as shown in FIG. 1.

In the blanking plate 10, through holes are formed corresponding to the arrangement positions of the openings 80 of the aperture member 8, and a blanker formed of two electrodes as a pair is disposed at each through hole. The multi-beam 30a to 30e, which pass through the through holes, are each independently deflected by a voltage applied to a blanker. Blanking control is performed on each beam by the deflection. In this manner, blanking deflection is performed by the blanking plate 10 on all beams in the multi-beam which have passed through the multiple openings 80 of the aperture member 8.

The multi-beam 30a to 30e which have passed through the blanking plate 10 are demagnified in beam size and arrangement pitch by the demagnifying lens 12, and travel to a central opening formed in the limiting aperture member 14. Here, an electron beam deflected by a blanker of the blanking plate 10 is deviated from its trajectory, displaced in position from the central opening of the limiting aperture member 14, and is blocked by the limiting aperture member 14. On the other hand, an electron beam not deflected by a blanker of the blanking plate 10 passes through the central opening of the limiting aperture member 14.

In this manner, the limiting aperture member 14 blocks the beams which are deflected so as to be in a beam-OFF state by blankers of the blanking plate 10. The beam which has passed through the limiting aperture member 14 in a period from beam-ON to beam-OFF forms the electron beam for one shot.

The multi-beam 30a to 30e which have passed through the limiting aperture member 14 are focused by the objective lenses in three stages 16, 17, 18 to form a pattern image with a desired demagnification ratio on the substrate 24. The electron beams (the whole multi-beam) which have passed through the limiting aperture member 14 are collectively deflected in the same direction and radiated to the substrate 24 by at least one of the electrostatic lenses 66, 67, 68 which also has a function of a deflector. When the XY stage 105 is continuously moved, beam deflection is performed so that the irradiation position of the beam follows the movement of the XY stage 22. In addition, as the XY stage 22 is moved, the writing position is changed accordingly, and the height of the surface of the substrate 24 irradiated with the multi-beam is changed. Thus, a displacement of the focal point of the multi-beam is dynamically corrected (dynamic focusing) by the electrostatic lenses 66, 67, 68 during writing.

Ideally, the multi-beam radiated at one time are arranged with a pitch which is the product of the arrangement pitch of the multiple openings 80 of the aperture member 8 and the above-mentioned desired demagnification ratio. The writing apparatus performs a writing operation by a raster scan method by which a shot beam is sequentially radiated, and when a desired pattern is written, a necessary beam is controlled at a beam-ON according to the pattern by the blanking control.

The controller C has a control calculation unit 32, a control circuit 34 and amplifiers 36, 37, 38. The control calculation unit 32 performs data conversion processing in multiple stages on writing data, generates shot data specific to the apparatus, and outputs the shot data to the control circuit 34. In the shot data, an irradiation amount and irradiation position coordinates of each shot are defined. The control circuit 34 calculates an irradiation time by dividing the irradiation amount of each shot by a current density. When a corresponding shot is performed, a deflection voltage is applied to a corresponding blanker of the blanking plate 10 so that beam-ON is assumed for the calculated irradiation time.

The amplifier 36 converts a digital signal output from the control circuit 34 into an analog signal, and applies a voltage to the electrostatic lens 66. The amplifier 37 converts a digital signal output from the control circuit 34 into an analog signal, and applies a voltage to the electrostatic lens 67. The amplifier 38 converts a digital signal output from the control circuit 34 into an analog signal, and applies a voltage to the electrostatic lens 68.

Next, a method of calculating voltages will be described, the voltages to be applied to the electrostatic lenses 66, 67, 68 in order to reduce the rotation and demagnification (magnification change) of a beam image due to dynamic focusing.

First, the voltages applied to the electrostatic lenses 67, 68 are fixed, and the beam shape (the shape of the whole multi-beam image) and the focus position are measured while the voltage applied to the electrostatic lens 66 is changed.

For the measurement of the beam shape, the inspection aperture 40 and the current detector 50 are used. For example, the blanking plate 10 is divided into multiple areas, and the inspection aperture 40 is scanned by the beams in each of the areas.

Each beam corresponding to one area (measurement area) among the multiple areas is set ON, and beams corresponding to other areas are set OFF. The XY stage 22 is moved, and the inspection aperture 40 is placed right below the beams in the measurement area. The multiple beams set ON in the measurement area are deflected to scan the inspection aperture 40, the electron beam to pass through the inspection aperture 40 is successively switched, and a beam current is detected by the current detector 50.

The control calculation unit 32 converts the beam current detected by the current detector 50 into brightness, creates a beam image based on the beam deflection amount, and performs image analysis. The control calculation unit 32 detects the position of each beam using the position of the XY stage 22. The control calculation unit 32 then calculates the central coordinates of a beam array corresponding to the measurement area from the position of each beam.

Such scan of the inspection aperture 40, image analysis, and calculation of the central coordinates of the beam array are performed on all the divided areas of the blanking plate 10. The beam shape is determined using the central coordinates of the beam array in each area.

Figure 3:
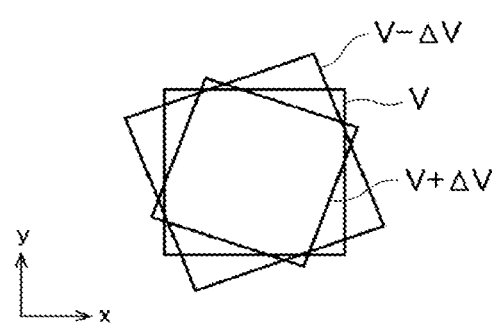
FIG. 3 is a view showing an example of a beam shape.

The beam shape is measured for each of the cases where the voltage applied to the electrostatic lens 66 is set to $V-\Delta V$, $V$, and $V+\Delta V$. For example, the result of measurement of the beam shape as shown in FIG. 3 is obtained. Fitting by the linear equations stated below is performed on each of three beam shapes: the beam shape when the voltage applied to the electrostatic lens 66 is set to $V-\Delta V$, the beam shape when the voltage applied to the electrostatic lens 66 is set to V, and the beam shape when the voltage applied to the electrostatic lens 66 is set to $V+\Delta V$.

$$X = A_0 + A_1 x + A_2 y$$
$$Y = B_0 + B_1 x + B_2 y \quad \text{(Equation 1)}$$

It is considered that $(A_1+B_2)/2$ is the demagnification term showing the demagnification level of a beam image, and $(B_1-A_2)/2$ is the rotational term showing the rotation level of a beam image. The demagnification term and the rotational term are determined for each of the applied voltages $V-\Delta V$, $V$, $V+\Delta V$. With demagnification term as the vertical axis and voltage applied to the electrostatic lens as the horizontal axis, an approximate straight line for plotted points is like #1 of FIG. 5*a*. With rotational term as the vertical axis and voltage applied to the electrostatic lens as the horizontal axis, an approximate straight line for plotted points is like #1 of FIG. 5*b*.

Figure 4:
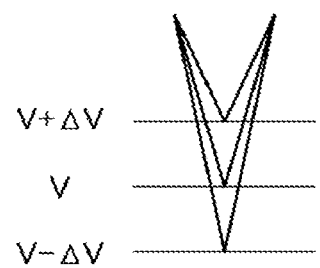
FIG. 4 is a view showing an example of a focus position.

In addition, the focus position is measured as shown in FIG. 4 for each of the cases where the voltage applied to the electrostatic lens 66 is set to $V-\Delta V$, $V$, and $V+\Delta V$. For the measurement of the focus position, with a fixed height of the inspection aperture 40 and variable excitation current values (lens values) of the object lenses 16 to 18, the inspection aperture 40 is scanned, and beam images with multiple lens values are created. The variance in brightness of the beam images is calculated. The closer the lens value to an optimal value, the higher the contrast of the beam image, and the greater the variance in brightness. Thus, the lens value corresponding to the beam image with the greatest variance in brightness is determined as the optimal lens value. The optimal lens value of each of the object lenses 16 to 18 is newly calculated for each of the cases where the voltage applied to the electrostatic lens 66 is set to $V-\Delta V$, $V$, and $V+\Delta V$. The focus position is set to the amount of change in focus corresponding to the amount of change in the optimal lens value.

With focus position as the vertical axis and voltage applied to the electrostatic lens as the horizontal axis, an approximate straight line for plotted points is like #1 of FIG. 5*c*.

Next, when the voltages applied to the electrostatic lenses 66, 68 are fixed, and the voltage applied to the electrostatic lens 67 is set to $V-\Delta V$, $V$, $V+\Delta V$, similarly, the beam shape is measured, the demagnification term and the rotational term are calculated, and the focus position is measured. An approximate straight line for the demagnification term, the rotational term, and the focus position is like #2 of FIG. 5*a*, FIG. 5*b*, FIG. 5*c*.

Next, when the voltages applied to the electrostatic lenses 66, 67 are fixed, and the voltage applied to the electrostatic lens 68 is set to V−ΔV, V, V+ΔV, similarly, the beam shape is measured, the demagnification term and the rotational term are calculated, and the focus position is measured. An approximate straight line for the demagnification term, the rotational term, the focus position is like #3 of FIG. 5a, FIG. 5b, FIG. 5c.

The slope of each approximate straight line of FIG. 5a, FIG. 5b, FIG. 5c is calculated. Let $a_1$, $a_2$, $a_3$ be the slopes of the lines #1, #2, #3 of FIG. 5a, respectively. $a_1$, $a_2$, $a_3$ are the rates of change in the demagnification term per unit voltage of the electrostatic lenses. Let $b_1$, $b_2$, $b_3$ be the slopes of the lines #1, #2, #3 of FIG. 5b, respectively. $b_1$, $b_2$, $b_3$ are the rates of change in the rotational term per unit voltage of the electrostatic lenses. Let $c_1$, $c_2$, $c_3$ be the slopes of the lines #1, #2, #3 of FIG. 5c, respectively. $c_1$, $c_2$, $c_3$ are the rates of change in the focus position per unit voltage of the electrostatic lenses.

When the demagnification, the rotation, and the focus position are corrected by the electrostatic lenses in three stages 66, 67, 68, the above-mentioned coefficients (slopes) $a_1$, $a_2$, $a_3$, $b_1$, $b_2$, $b_3$, $c_1$, $c_2$, $c_3$ are used.

For example, the beam shape and the focus position are measured at the time of application of an arbitrary voltage to the electrostatic lenses 66, 67, 68, and the demagnification term and the rotational term are calculated from the beam shape. For each of the demagnification term, the rotational term and the focus position, the difference from an ideal value (target value) is determined. The difference provides the amount of correction to the demagnification term, the rotational term and the focus position. Let α be the amount of correction to the demagnification term, β be the amount of correction to the rotational term, γ be the amount of correction to the focus position, then the amount (voltage) $r_1$ of correction to the voltage applied to the electrostatic lens 66, the amount (voltage) $r_2$ of correction to the voltage applied to the electrostatic lens 67, and the amount (voltage) $r_3$ of correction to the voltage applied to the electrostatic lens 68 can be calculated by solving the simultaneous equations below.

$$a_1 r_1 + a_2 r_2 + a_3 r_3 = \alpha$$

$$b_1 r_1 + b_2 r_2 + b_3 r_3 = \beta$$

$$c_1 r_1 + c_2 r_2 + c_3 r_3 = \gamma \quad \text{(Equation 2)}$$

The demagnification term, the rotational term, and the focus position can be shifted by α, β, γ, respectively by adding $r_1$ to the voltage applied to the electrostatic lens 66, $r_2$ to the voltage applied to the electrostatic lens 67, and $r_3$ to the voltage applied to the electrostatic lens 68.

In this manner, according to the present embodiment, it is possible to quickly calculate optimal voltages to be applied to the electrostatic lenses in multiple stages to reduce the demagnification and the rotation of a beam image due to dynamic focusing.

Z stage (not shown) as the seat is provided on the XY stage 22, and the substrate 24 is placed on the Z stage by bottom surface three-point support. The substrate 24 on the Z stage has a varied surface height (Z height) due to irregularities on the surface caused by bending. Such variation in the Z height of the substrate 24 causes demagnification and rotation of a beam image, and displacement of the focus position. Hereinafter, a method of correcting the demagnification and the rotation of a beam image and the displacement of the focus position due to the Z height will be described. Note that as a substitute for the Z stage, multiple inspection apertures and current detectors set at different heights may be used.

First, the coefficients $a_1$, $a_2$, $a_3$, $b_1$, $b_2$, $b_3$, $c_1$, $c_2$, $c_3$ described in the embodiment are calculated.

Next, the Z stage is driven to vary the height of the substrate 24 from the original position by ΔZ, and a voltage in proportion to ΔZ is added to each voltage applied to the electrostatic lenses 66, 67, 68. When the proportionality coefficients are $s_1$, $s_2$, $s_3$, the voltage $s_1 \Delta Z$ is added to the voltage applied to the electrostatic lens 66, the voltage $s_2 \Delta Z$ is added to the voltage applied to the electrostatic lens 67, and the voltage $s_3 \Delta Z$ is added to the voltage applied to the electrostatic lens 68. $s_1$, $s_2$, $s_3$ may be set to any value as long as the product of the value and ΔZ gives a voltage practically applicable to the electrostatic lenses 66, 67, 68.

In this state, in the same manner as in the embodiment, the beam shape is measured, the demagnification term and the rotational term are calculated, and the focus position is measured.

Next, the Z stage is driven to vary the height of the substrate 24 from the original position by −ΔZ, and a voltage in proportion to −ΔZ is added to each voltage applied to the electrostatic lenses 66, 67, 68. Specifically, the voltage $-s_1 \Delta Z$ is added to the voltage applied to the electrostatic lens 66, the voltage $-s_2 \Delta Z$ is added to the voltage applied to the electrostatic lens 67, and the voltage $-s_3 \Delta Z$ is added to the voltage applied to the electrostatic lens 68.

In this state, in the same manner as in the embodiment, the beam shape is measured, the demagnification term and the rotational term are calculated, and the focus position is measured.

With Z as the horizontal axis and demagnification term as the vertical axis, the straight line passing through the points obtained by plotting the demagnification term when the Z height is varied by ΔZ, and the demagnification term when the Z height is varied by −ΔZ is like the one in FIG. 6. The slope (the slope of the demagnification term with respect to Z) α' of the straight line is determined. Similarly, the slope β' of the rotational term with respect to Z, and the slope γ' of displacement of the focus position when Z is set are determined. Let $a_4$ be the rate of change in the demagnification term, let $b_4$ be the rate of change in the rotational term, and let $c_4$ be the rate of change in the displacement of the focus position observed on the inspection aperture, the changes being caused by driving the Z stage without varying the voltage of the electrostatic lenses, then the following simultaneous equations hold.

$$a_1 s_1 z + a_2 s_2 z + a_3 s_3 z + a_4 z = \alpha' z$$

$$b_1 s_1 z + b_2 s_2 z + b_3 s_3 z + b_4 z = \beta' z$$

$$c_1 s_1 z + c_2 s_2 z + c_3 s_3 z + c_4 z = \gamma' z \quad \text{(Equation 3)}$$

Dividing the entire simultaneous equations by Z gives the following.

$$a_1 s_1 + a_2 s_2 + a_3 s_3 + a_4 = \alpha'$$

$$b_1 s_1 + b_2 s_2 + b_3 s_3 + b_4 = \beta'$$

$$c_1 s_1 + c_2 s_2 + c_3 s_3 + c_4 = \gamma' \quad \text{(Equation 4)}$$

Focus correctable ratios $S_1$, $S_2$, $S_3$ causing no demagnification and rotation are given when the right side of Mathematical Equation 4 is 0, thus the following equations should be solved.

$$a_1 S_1 + a_2 S_2 + a_3 S_3 + a_4 = 0$$

$$b_1 S_1 + b_2 S_2 + b_3 S_3 + b_4 = 0$$

$$c_1 S_1 + c_2 S_2 + c_3 S_3 + c_4 = 0 \quad \text{(Equation 5)}$$

Mathematical Equation 4 is subtracted from Mathematical Equation 5, and let $s_1' = S_1 - S_1$, $s_2' = S_2 - S_2$, $S_3' = S_3 - S_3$, then the following equations are obtained.

$$a_1 s_1' + a_2 s_2' + a_3 s_3'' = -\alpha'$$

$$b_1 s_1' + b_2 s_2' + b_3 s_3' = \beta'$$

$$c_1 s_1' + c_2 s_2' + c_3 s_3' = \gamma' \quad \text{(Equation 6)}$$

Solving Mathematical Equation 6 determines $s_1'$, $s_2'$, $s_3'$. Since $s_1$, $s_2$, $s_3$ are known, $S_1$, $S_2$, $S_3$ calculated by $S_1 = s_1 + s_1'$, $S_2 = S_2 + s_2'$, $S_3 = S_3 + s_3'$ give focus adjustable cooperative ratios to reduce the demagnification and the rotation of a beam image.

The demagnification and the rotation of a beam image and displacement of the focus position due to irregularities on the surface of the substrate 24 can be corrected by adding $S_1 z$ to the voltage applied to the electrostatic lens 66, $S_2 z$ to the voltage applied to the electrostatic lens 67, and $S_3 z$ to the voltage applied to the electrostatic lens 68. For example, the distribution of the surface height of the substrate 24 is measured in advance, and during a writing process in which the substrate 24 is irradiated with a multi-beam, correction can be made in real time (actual time) by adding a voltage according to the height of a beam irradiation position to each voltage applied to the electrostatic lenses 66, 67, 68 using the proportionality coefficients $S_1$, $S_2$, $S_3$.

The posture of the XY stage 22 on which the substrate 24 is placed may not be aligned with the stage movement direction. In this case, as shown in FIG. 7, the substrate 24 is also in a rotational posture, thus it is preferable to rotate the irradiation area BR of the multi-beam according to the rotation of the substrate 24. Specifically, the beam image is rotated without causing demagnification of the beam image and displacement of the focus position.

First, the coefficients $a_1$, $a_2$, $a_3$, $b_1$, $b_2$, $b_3$, $c_1$, $c_2$, $c_3$ described in the embodiment are calculated.

Next, the amount $\theta$ of rotation of the XY stage 22 is measured using a laser length measurement system (not illustrated). For example, a laser is reflected on a mirror installed in the XY stage 22, the positions of two points on the XY stage 22 are measured, and the amount $\theta$ (yaw angle) of rotation is obtained from the difference between the positions of the two points.

Subsequently, the coefficients $t_1$, $t_2$, $t_3$ which satisfy the following simultaneous equations are determined.

$$a_1 t_1 \theta + a_2 t_2 \theta + a_3 t_3 \theta = 0$$

$$b_1 t_1 \theta \pm b_2 t_2 \theta + b_3 t_3 \theta = 0$$

$$c_1 t_1 \theta + C_2 t_2 \theta + c_3 t_3 \theta = 0 \quad \text{(Equation 7)}$$

The beam image can be rotated $\theta$, and aligned with the posture of the substrate 24 while reducing the variation in demagnification of the beam image and the displacement of the focus position by adding $t_1 \theta$ to the voltage applied to the electrostatic lens 66, $t_2 \theta$ to the voltage applied to the electrostatic lens 67, and $t_3 \theta$ to the voltage applied to the electrostatic lens 68.

The ultimate voltages $V_1$, $V_2$, $V_3$ to be applied to the electrostatic lenses 66, 67, 68 can be calculated as follows by adding the voltages $r_1$, $r_2$, $r_3$ calculated from Mathematical Equation 2, the voltages $S_1 z$, $S_2 z$, $S_3 z$ calculated from Mathematical Equation 6, and the voltages $t_1 \theta$, $t_2 \theta$, $t_3 \theta$ calculated from Mathematical Equation 7 to offset voltages $O_1$, $O_2$, $O_3$ currently set in the electrostatic lenses 66, 67, 68.

$$V_1 = O_1 + r_1 + S_1 z + t_1 \theta$$

$$V_2 = O_2 + r_2 + S_2 z + t_2 \theta$$

$$V_3 = O_3 + r_3 + S_3 z + t_3 \theta \quad \text{(Equation 8)}$$

Before a writing process, the coefficients $a_1$, $a_2$, $a_3$, $b_1$, $b_2$, $b_3$, $c_1$, $c_2$, $c_3$, $S_1$, $S_2$, $S_3$, $t_1$, $t_2$, $t_3$ are determined. During a writing process, a voltage correction amount is calculated according to the height of the substrate surface and the amount of rotation of the stage, and the voltage correction amount is added to each voltage applied to the electrostatic lenses 66, 67, 68.

In the embodiment, demagnification of a beam image, rotation of a beam image, and focus position are three items which are correction targets, and the object lenses and the electrostatic lenses use a three-stage configuration. However, a two or more stage configuration is applicable, and the object lenses and the electrostatic lenses may have a four or more stages according to the number of correction targets. For example, when the focus variation is small, the object lenses and the electrostatic lenses use a two-stage configuration. In addition, when demagnification of a beam image is handled separately for the x direction and the y direction, four items of correction targets are provided, thus the object lenses and the electrostatic lenses are provided in four stages.

In the embodiment, an example has been described in which the coefficients $a_1$, $a_2$, $a_3$, $b_1$, $b_2$, $b_3$, $c_1$, $c_2$, $c_3$, $S_1$, $S_2$, $S_3$, $t_1$, $t_2$, $t_3$ are determined by solving simultaneous equations; however, the coefficients may be calculated using a map (table).

In the embodiment, an example has been described in which electrostatic lenses in three stages 66 to 68 corresponding to object lenses in three stages 16 to 18 are provided; however, magnetic field lenses may be provided instead of the electrostatic lenses. In short, first to third magnetic field lenses corresponding to the object lenses 16 to 18 may be provided. When an electrostatic lens is used, an excitation parameter as a control target is an applied voltage, and when a magnetic field lens is used, an excitation parameter as a control target is an excitation current.

A magnetic field lens (magnetic field correction lens) generates a micro rotational symmetric magnetic field to slightly move an image forming position. For example, the magnetic field lens is a circular coil or a solenoid coil with a central axis of a beam path, and the coil may be surrounded by a magnetic material, such as ferrite, or the coil may not be surrounded by a magnetic material.

The amplifiers 36 to 38 convert a digital signal output from the control circuit 34 into an analog signal, and controls the excitation currents for the first to third magnetic field lenses.

Figure 8:
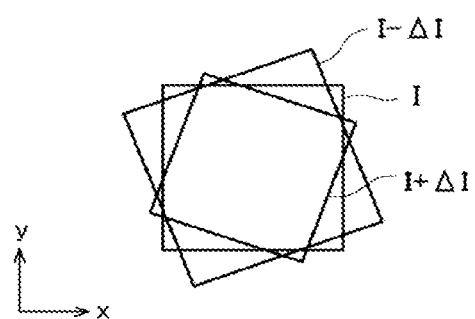
FIG. 8 is a view showing an example of a beam shape.

The excitation currents for the first to third magnetic field lenses to reduce the demagnification and the rotation of a beam image due to dynamic focusing are calculated. The excitation currents for the second and third magnetic field lenses are fixed, and the beam shape is measured for each of the cases where the excitation current for the first magnetic field lens is set to I−ΔI, I, and I+ΔI. For example, the result of measurement of the beam shape as shown in FIG. 8 is obtained. Fitting by Mathematical Equation 1 is performed on three beam shapes to determine the demagnification term $(A_1+B_2)/2$, the rotational term $(B_1-A_2)/2$.

Figure 9:
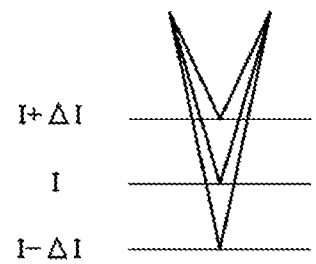
FIG. 9 is a view showing an example of a focus position.

As shown in FIG. 9, the focus position is measured for each of the cases where the excitation current for the first magnetic field lens is set to I−ΔI, I, and I+ΔI. The slope of an approximate straight line for the demagnification term, the rotational term, and the focus position for the excitation current is calculated.

Next, when the excitation currents for the first and third magnetic field lenses are fixed, and the excitation current for the second magnetic field lens is set to I−ΔI, I, and I+ΔI, similarly, the beam shape is measured, the demagnification term and the rotational term are calculated, the focus position is measured, and an approximate straight line is calculated.

Subsequently, when the excitation currents for the first and second magnetic field lenses are fixed, and the excitation current for the third magnetic field lens is set to I−ΔI, I, and I+ΔI, similarly, the beam shape is measured, the demagnification term and the rotational term are calculated, the focus position is measured, and an approximate straight line is calculated.

Subsequently, calculation in the same manner as in the case of electrostatic lens enables quick calculation of the excitation currents for electromagnetic lenses in multiple stages to reduce the demagnification and the rotation of a beam image due to dynamic focusing.

A magnetic field lens is inferior to an electrostatic lens in terms of quick responsiveness. However, it is sufficient that correction in response to change in the substrate surface height follow slow change due to mechanical movement of the substrate on the stage, thus a magnetic field lens may be used.

Although a multi beam writing apparatus has been described in the embodiment, the invention is applicable to other multi beam irradiation apparatuses, such as a multi beam inspection apparatus.

The present invention is described above in detail with reference to particular aspects, but it should be clear to the skilled person in the art that various modifications are possible without departing from the intention and scope of the present invention.

The present application is based upon Japanese Patent Application No. 2019-210594, filed on Nov. 21, 2019, the entire contents of which are incorporated herein by reference.

REFERENCE SIGNS LIST

2 ELECTRON BEAM COLUMN
4 ELECTRON GUN
6 ILLUMINATING LENS
8 APERTURE MEMBER
10 BLANKING PLATE
12 DEMAGNIFYING LENS
14 LIMITING APERTURE MEMBER
16 to 18 OBJECT LENS
20 WRITING CHAMBER
22 XY STAGE
24 SUBSTRATE
40 INSPECTION APERTURE
50 CURRENT DETECTOR
66 to 68 ELECTROSTATIC LENS

The invention claimed is:

1. A multi charged particle beam adjustment method comprising:
   forming a multi charged particle beam;
   calculating, for each of lenses in two or more stages disposed corresponding to object lenses in two or more stages, a first rate of change and a second rate of change in response to change in at least an excitation parameter, the first rate of change being a rate of change in a demagnification level of a beam image of the multi charged particle beam, the second rate of change being a rate of change in a rotation level of the beam image; and
   calculating a first amount of correction to the excitation parameter of each of the lenses based on an amount of correction to the demagnification level and the rotation level of the beam image, the first rate of change, and the second rate of change.

2. The multi charged particle beam adjustment method according to claim 1, further comprising calculating a third rate of change in response to change in the excitation parameter for each of the lenses, the third rate of change being a rate of change in focus position,
   wherein in a step of calculating the first amount of correction, the third rate of change is further used.

3. The multi charged particle beam adjustment method according to claim 2, further comprising:
   calculating a fourth rate of change, a fifth rate of change, and a sixth rate of change in response to change in a surface height of a substrate irradiated with the multi charged particle beam, the fourth rate of change being a rate of change in the demagnification level of the beam image, the fifth rate of change being a rate of change in the rotation level of the beam image, the sixth rate of change being a rate of change in the focus position, and
   calculating a second amount of correction to the excitation parameter of each of the lenses in real time as the substrate is irradiated with the multi charged particle beam, based on the surface height of the substrate at an irradiation position of the multi charged particle beam, the first rate of change, the second rate of change, the third rate of change, the fourth rate of change, the fifth rate of change and the sixth rate of change.

4. The multi charged particle beam adjustment method according to claim 3,
   wherein the fourth rate of change, the fifth rate of change, the sixth rate of change are each a rate of change when the excitation parameter in response to change in the surface height of the substrate is set in the lenses.

5. The multi charged particle beam adjustment method according to claim 3, further comprising:
   measuring a yaw rotation amount of a stage on which the substrate irradiated with the multi charged particle beam is placed; and
   calculating a third amount of correction to the excitation parameter of each of the lenses based on the rotation amount, the first rate of change, the second rate of change and the third rate of change.

6. The multi charged particle beam adjustment method according to claim 1,
   wherein the lenses disposed corresponding to the object lenses are electrostatic lenses, and the excitation parameter is an applied voltage.

7. The multi charged particle beam adjustment method according to claim 1,
   wherein the lenses disposed corresponding to the object lenses are magnetic field lenses, and the excitation parameter is an excitation current.

8. A multi charged particle beam irradiation method comprising:
   forming a multi charged particle beam;
   calculating, for each of lenses in two or more stages disposed corresponding to object lenses in two or more stages, a first rate of change and a second rate of change in response to change in at least an excitation parameter, the first rate of change being a rate of change in a demagnification level of a beam image of the multi charged particle beam, the second rate of change being a rate of change in a rotation level of the beam image;

calculating a first amount of correction to the excitation parameter of each of the lenses based on an amount of correction to the demagnification level and the rotation level of the beam image, the first rate of change, and the second rate of change; and setting the excitation parameter with the first amount of correction added to the lenses, and irradiating a substrate with the multi charged particle beam.

9. A multi charged particle beam irradiation apparatus comprising:

a plurality of blankers performing blanking deflection on respective parts of a multi charged particle beam;

a limiting aperture member blocking beams which are deflected by the plurality of blankers to assume a beam off state;

object lenses in two or more stages, that focus the multi charged particle beam which has passed the limiting aperture member to a substrate;

lenses in two or more stages disposed corresponding to the object lenses; and a controller calculating a first amount of correction to an excitation parameter of each of the lenses based on a first rate of change, a second rate of change, and an amount of correction in response to change in the excitation parameter for each of the lenses, and setting the excitation parameter with the first amount of correction added to the lenses, the first rate of change being a rate of change in a demagnification level of a beam image of the multi charged particle beam, the second rate of change being a rate of change in a rotation level of the beam image, the amount of correction being made to the demagnification level and the rotation level of the beam image.

* * * * *